United States Patent [19]
Ballard

[11] Patent Number: 5,737,497
[45] Date of Patent: Apr. 7, 1998

[54] TEST SYSTEM WITH INFERENCE CIRCUIT

[75] Inventor: Dan Ballard, San Diego, Calif.

[73] Assignee: Reticular Systems, Inc., San Diego, Calif.

[21] Appl. No.: 528,314

[22] Filed: Sep. 14, 1995

Related U.S. Application Data

[62] Division of Ser. No. 393,241, Feb. 23, 1995, Pat. No. 5,487,134, which is a continuation of Ser. No. 23,059, Feb. 25, 1993, abandoned.

[51] Int. Cl.$^6$ .................................................. G06F 15/18
[52] U.S. Cl. ................ 395/50; 395/183.02; 395/183.06; 395/916
[58] Field of Search ................ 371/22.3; 395/183.06, 395/50, 10, 916, 183.02

[56] References Cited

U.S. PATENT DOCUMENTS

| | | | |
|---|---|---|---|
| 4,649,515 | 3/1987 | Thompson et al. | 395/64 |
| 4,837,735 | 6/1989 | Allen, Jr. et al. | 364/200 |
| 4,922,432 | 5/1990 | Kobayashi et al. | 364/490 |
| 4,924,408 | 5/1990 | Highland | 395/64 |
| 4,939,680 | 7/1990 | Yoshida | 395/11 |
| 5,063,522 | 11/1991 | Winters | 395/51 |
| 5,072,405 | 12/1991 | Ramakrishna et al. | 395/64 |
| 5,115,435 | 5/1992 | Langford, II et al. | 371/22.3 |

FOREIGN PATENT DOCUMENTS

| | | | |
|---|---|---|---|
| 1272291 | 7/1990 | Canada | G06F 15/18 |
| 0320957 | 6/1989 | European Pat. Off. | G06F 9/44 |

OTHER PUBLICATIONS

Devedzic, Vladan, et al. "An Architecture for Real–Time Inference Engines on Personal Computers", Proc. 25th Annual Hawaii Int. Conf. on System Sciences, vol. 1, No. 7, Jan. 10, 1992.

Hanyu Takahiro, "Design of a Multiple–Valued Rule–Programmable Matching VLSI Chip for Real–Time Rule–Based Systems", Proc. 22nd Int. Symp. on Multiple Valued Logic, pp. 274–281, May 27, 1992.

(List continued on next page.)

*Primary Examiner*—Robert W. Downs
*Attorney, Agent, or Firm*—Knobbe, Martens, Olson & Bear, LLP

[57] ABSTRACT

A rule based processing system that is optimized for implementation in hardware. The system includes a set of logic gates that are used to implement a rule network connected to a working memory composed from a set of memory components. When a set of inputs are presented to the logic gates, a set of inferences are formed and the results are stored in the memory components. The inferences that are stored in the working memory are used to determine the state of the system at any given time. These inferences can be output to an external device to report on the status of the system. The rule based production system is designed to be implementable on a high performance semiconductor microchip and is thus suitable for use in embedded real-time applications.

5 Claims, 12 Drawing Sheets

OTHER PUBLICATIONS

A.M. Abd-Alla and A.C. Meltzer, Principles of Digital Computer Design, Prentice-Hall, Inc., pp. 147–149, Dec. 1976.

G.L. Castrodale et al., "An Interactive Environment for the Transparent Logic Simulation and Testing of Integrated Circuits," Proc. 1990 Int'l. Test Conference, pp. 394–403, Sep. 1990.

K. Fitzgerald, "Test and Measurement: Design-for-testability products in vogue Communications testing diversifies Artificial Intelligence in a tester VXI blossoms," IEEE Spectrum, pp. 56–58, Jan. 1991.

R.P. van Riessen et al., "A Design-For-Testability Expert System for Silicon Compilers," 1991 VLSI Test Symposium, pp. 10–15, Apr. 1991.

C. Preist et al., "An Expert System to Peform Functional Diagnosis of a Bus Subsystem," Proc. 8th Conf. on Artificial Intelligence for Applications, pp. 88–95, Mar. 1992.

T. Hanyu et al., "Dynamically Rule-Programmable VLSI Processor for Fully-Parallel Inference," Electronics Letters, vol. 28 (7), pp. 695–697, Mar. 1992.

Y. Zorian, "A Universal Testability Strategy for Multi-Chip Modules Based on BIST and Boundary-Scan," 1992 Int'l. Conf. on Computer Design, pp. 59–66, Oct. 1992.

N.L. Griffin and F.D. Lewis, "A Rule-Based Inference Engine which is Optimal and VLSI Implementable," IEEE Int'l. Workshop on Tools for AI Architectures, Languages, and Algorithms, pp. 246–251, Oct. 1989.

TEST SYSTEM WITH INFERENCE CIRCUIT

This application is a divisional of U.S. patent application Ser. No. 08/393,241, filed Feb. 23, 1995, now U.S. Pat. No. 5,487,134, which was a file wrapper continuation of U.S. patent application Ser. No. 08/023,059, filed Feb. 25, 1993, abandoned.

BACKGROUND OF THE INVENTION

1. Field of the Invention

The present invention is related to artificial intelligence systems and more particularly, to rule based expert systems.

2. Description of the Related Technology

The techniques used in typical artificial intelligence systems have been proven to be efficient in solving very complex problems. A standard expert system architecture comprises a rule base and a fact base. The rule base consists of a series of inferencing patterns which are called rules, and the fact base consists of a series of data patterns which describe the present condition of the system and are called facts. A typical rule based expert system uses a large number of IF-THEN rules, also called productions, to control the actions of the system (e.g., IF the pattern of a rule matches a pattern in the fact base, THEN a specific action is asserted in the system). In normal operation, the expert system will progress through each rule, and compare that rule to each fact pattern in the fact base looking for a match. The determination of a match between a rule and a specific fact often takes a significant amount of processing power and time. As the complexity of the expert system increases, the number of rules and fact patterns will increase, and necessarily so will the computational time spent looking for matches. Therefore, as the number of rules and system conditions, or facts, increase, the overall reaction time of the system will increase. In many cases, this slow reaction time causes expert systems to be useless for real-time applications, i.e., where a processing function must be completed within a predetermined time.

Traditional von Neumann computer architectures are very inefficient in performing the kinds of processing required in an expert system. In an article by A. Gupta, published in 1987, entitled *Parallelism in Production Systems*, it is shown that production systems spend about 90% of their time performing pattern matching. More efficient and effective execution architectures are required to make it feasible to use expert systems in real-time applications where high performance computers are not viable design alternatives, because of cost, size and reliability problems.

Further, expert systems have historically required extensive amount of computational resources, i.e., processor or CPU power, to efficiently match the rule patterns to the fact patterns. To accommodate the necessary CPU power, many expert systems of significance must be run on huge computer systems. These computer systems also include expanded memory in order to handle the large number of variables whose condition must be stored in the fact base. Such large computer systems are not suitable for embedding in other application specific systems, and therefore limit the number of suitable applications for traditional expert system architectures.

For example, in a typical test system environment, the condition of a multitude of variables must be monitored and then various outputs are produced depending on the condition of a defined set of the variables. An expert system, or inferencing mechanism, is designed to determine the condition of parameters and effect an output based on the conditions, therefore an expert system would be ideal for such an application. However traditional expert systems are not suited for embedded test applications due to their burdensome processing requirements. Further, prior embedded expert systems have typically been too slow for a real-time test system. Thus, there exists a need for a real-time expert system, that may be embedded in, for example, test system applications.

SUMMARY OF THE INVENTION

The present invention includes an expert system architecture which is optimized for implementation in hardware. The expert system of the present invention comprises a set of logic gates representative of a rule network and a set of memory components representative of a working memory. A set of signal lines connect the logic and memory components so that upon presentation of inputs to the logic gates the result of inferences are stored in the working memory and thereby provide a set of outputs. The preferred embodiment of the invention is implemented on a high performance micro-chip which requires relatively small amounts of silicon real estate and is thus suitable for use in embedded real-time applications.

In one aspect of the invention there is a universal test system, comprising a production system processor having an inference circuit, comprising a rule network connected to a working memory, means for receiving input data from a bus and applying the input data to the inference circuit, and means for reading output data from the inference circuit and transmitting the output data to the bus; and a plurality of system circuits containing boundary-scan inputs and outputs in communication with the production system processor over the bus so that the system circuits are tested.

BRIEF DESCRIPTION OF THE DRAWINGS

FIG. 11b is a schematic diagram of an exemplary goal directed logic circuit corresponding to the rule network shown in FIG. 11a;

DETAILED DESCRIPTION OF THE INVENTION

The present invention includes an expert system architecture which is optimized for implementation in hardware. The expert system of the present invention is also referred to as a production system, because it implements IF-THEN type rules, which are called productions, and asserts conclusions into a working memory. For many embedded applications, it would be desirable to implement the hardware of the production system on a single high performance silicon chip.

Figure 1:
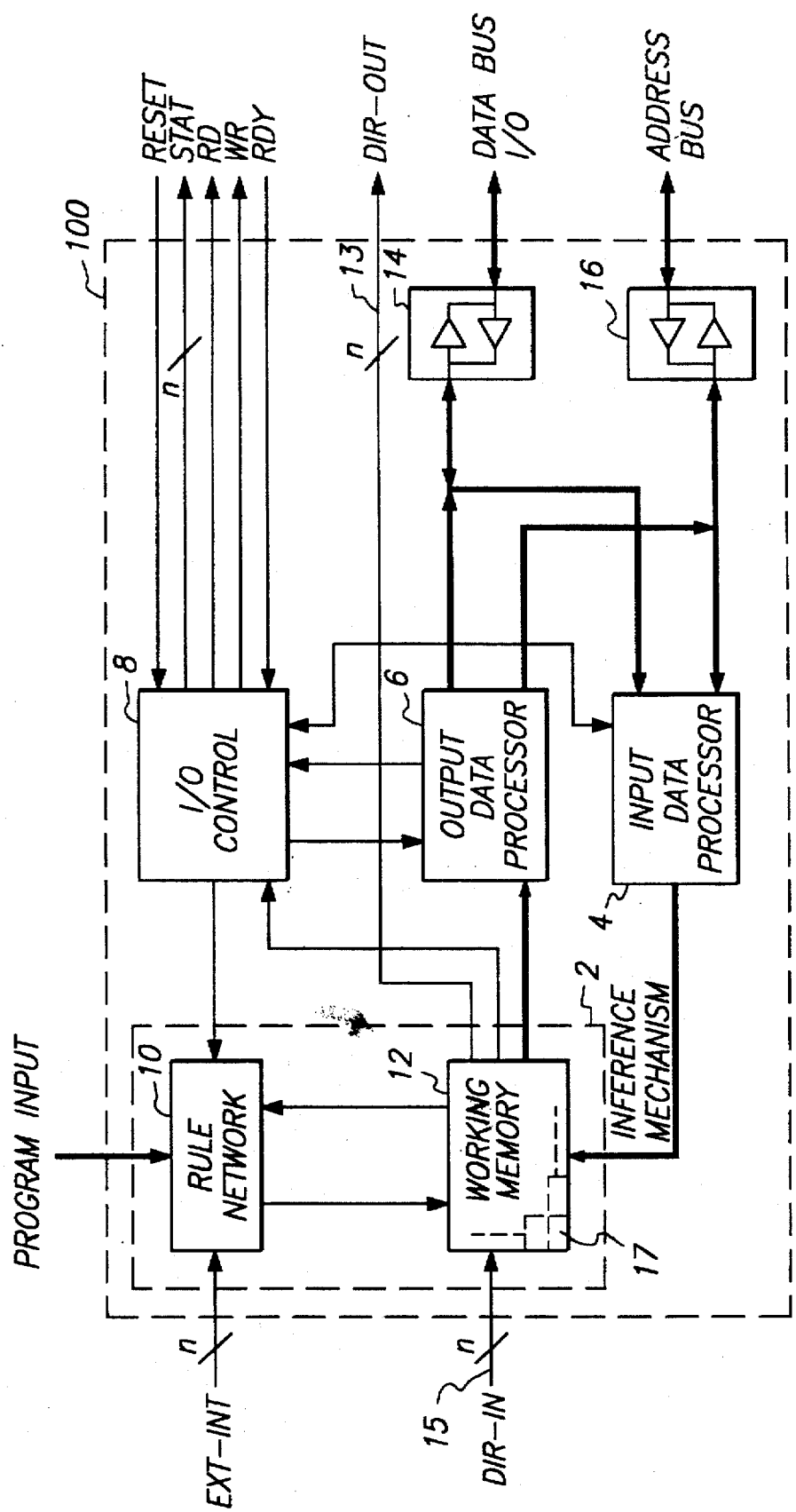
FIG. 1 is a block diagram of one presently preferred embodiment of a production system processor of the present invention.

The preferred embodiment of the expert system architecture of the present invention is implemented as a production system processor 100 on a single semiconductor chip. The block diagram of the production system processor 100 is illustrated in FIG. 1. The production system processor 100 comprises four major components, each of which will be described in more detail below, an inference mechanism 2, an input data processor 4, an output data processor 6 and I/O control logic 8. The inference mechanism 2 comprises a rule network 10 implemented in a set of logic gates, and a working memory 12 which is implemented in a set of memory elements 17 (shown in phantom).

The input data processor 4 and output data processor 6 are provided to enable large numbers of input data and output data to be handled by the production system processor 100. Further, the data processors 4, 6 enable the production system processor 100 to communicate with external I/O devices such as sensors, external memory devices, external action elements, etc. The data processors 4, 6 communicate with these external devices through a conventional data bus 14 and an address bus 16.

If immediate access to the inference mechanism 2 is required, there are direct input and output lines which bypass the data processors 4, 6. A set of n DIR-OUT lines 13 bypass the output data processor 6 and deliver output data from the inference mechanism 2 to an external device without any delays. A set of n DIR-IN lines 15 allow immediate input data to be provided to the working memory 12 to update the inference mechanism 2 on the status of the system. The system I/O control logic 8 is provided to enable the processor 100 to communicate with the control lines from external system elements. The preferred production processor 100 of the present invention can run in a stand-alone mode or it can be slaved to another processor if desired.

The inference mechanism 2 is the heart of the production system processor 100. The inference mechanism 2 comprises the working memory 12 and the rule network 10 which are in constant communication with each other to update the production system processor 100 on the state of an attached embedded system, e.g., system 174 (FIG. 15) at all times. The working memory 12 is basically a set of memory elements 17 which are used to store a set of conditions of the system at an instant in time. The working memory 12 is therefore updated, at each system clock cycle, to store the most current system information. Each condition of the system is stored in its own working memory element 17.

The rule network 10 of the production system 100, comprises a set of rules which defines the required status of the specific system conditions, i.e., the state of the working memory element 17 assigned to that condition, and the resulting actions which are to be taken if these specific conditions occur. There are three types of information that are handled by a typical rule network 10 as follows: (a) the contents of the working memory 12, (b) the logical relationships between the working memory elements 17, and (c) actions which must be performed on a working memory element 17.

Figure 2:
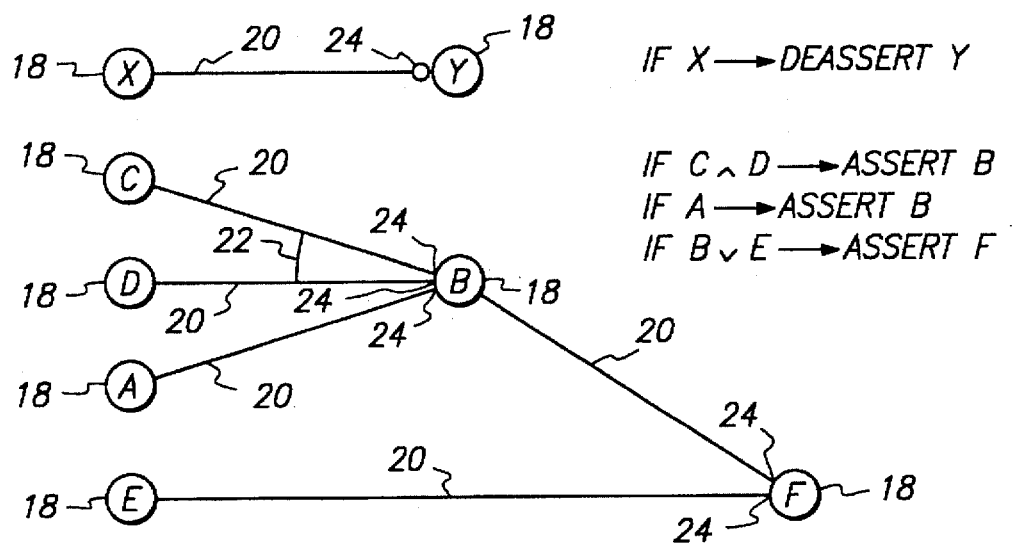
FIG. 2 is a graphical representation of an exemplary rule network.

In the exemplary rule network 10 of FIG. 2, each node 18 represents a working memory element 17. A straight line 20, and an arced junction 22 represent the logical relations between these working memory elements 17. The end 24 of the straight line before the node 18 represents the action which is to be taken on the working element 17 as a result of the occurrence of these conditions. The first production of the exemplary rule network 10 can be translated as: If X, then retract (or deassert) Y. The second production of the exemplary rule network 10 can be broken down into several subproductions which can be described as follows: If C and D then assert B, If A then assert B, and if B or E then assert F.

In the preferred embodiment of the production system processor 100 (FIG. 1), the rule network 10 is static and is predetermined for a specific type of application. In a static rule network 10, the occurrence of a specific set of conditions will always result in the same predetermined set of actions to be taken. A static rule network 10 reduces flexibility since the rules are hard-wired in semiconductors. However, each embodiment of the static rule network 10 is optimized for the specific rules that apply to its individual application. Therefore, various embodiments of the static rule network 10 can be designed, optimized and implemented for the individual needs of different applications.

Figure 3:
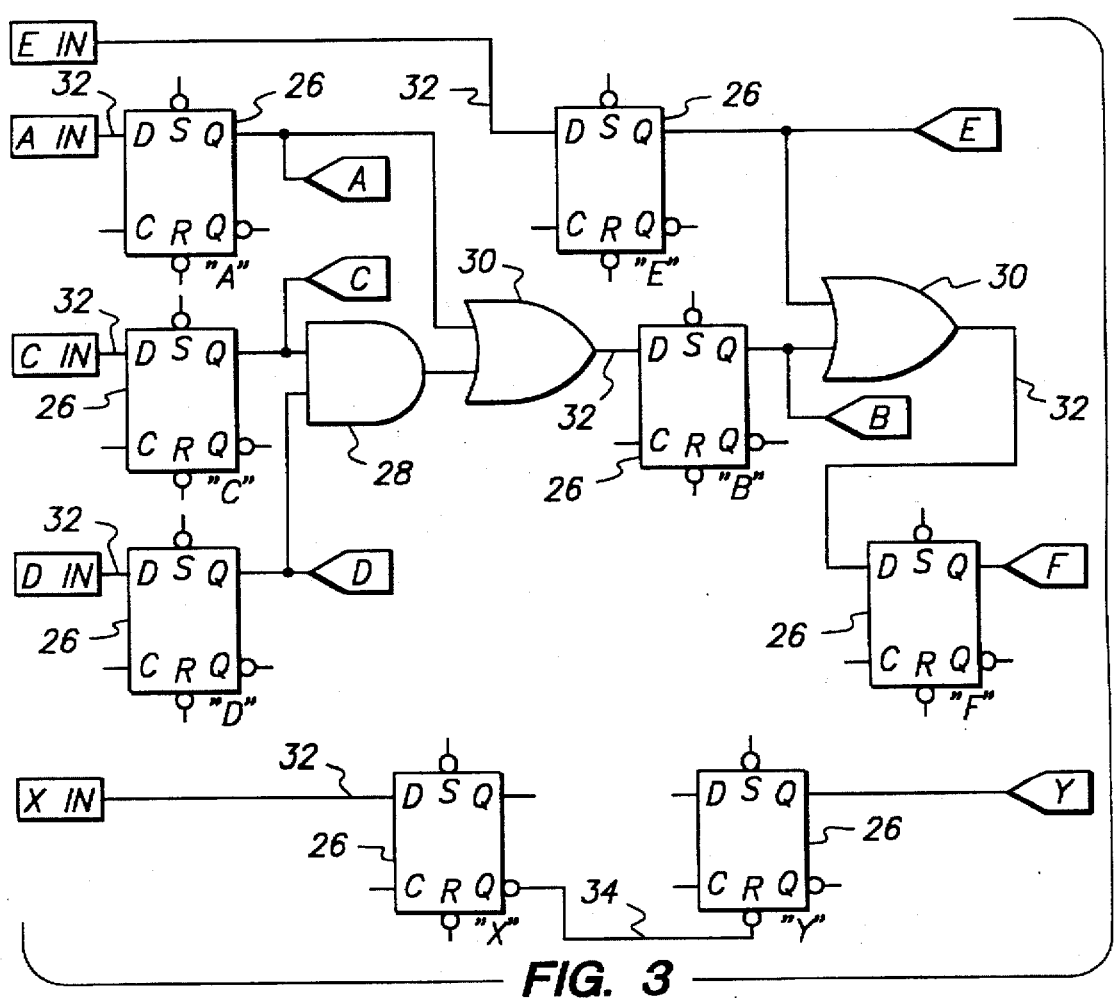
FIG. 3 is a logic schematic of an exemplary lay out of a digital logic network to simulate the operation of the exemplary rule network of FIG. 2, and which could be located in the system architecture of FIG. 1.

Referring now to FIG. 3, the rule network 10 (FIG. 1) of the preferred production processing system of the present invention is implemented using digital logic elements. The contents of the working memory 12 are determined by reading the state of the working memory storage elements 17 which are implemented as flip-flops 26. The logical relationships between working memory elements 17 are implemented by connecting specific flip flops 26, to logic gates to define the required system conditions. Finally, the actions which are performed on the working memory elements 17 are implemented by either setting or clearing specific flip flops 26. The exemplary rule network 10 of FIG. 2 can therefore be represented as a series of flip flops 26 and logic elements as illustrated in FIG. 3.

In FIG. 3, each working memory element 17 is represented by a flip-flop 26. The conjunction of two terms, e.g., C and D, is represented by an AND gate 28. The disjunction of two terms, e.g., E or B, is represented by an OR gate 30. An assertion of a working memory element 17 is represented by providing a logical one to the input 32 of the flip-flop 26 thus setting the flip-flop 26. A retraction of a working memory element 17 is represented by providing a logical zero to the reset terminal 34 of the flip-flop 26, thus resetting the flip-flop 26 e.g., element "y". The rule network 10 defined by the user is minimized using minimization software in a compiler program 36 as described below to enable the rules of the static rule network 10 to be implemented using a minimal number of logic gates.

Further, the rule network 10 of the production system processor 100 is designed such that substantially all of the rules or productions of the rule network 10 are performed simultaneously. This is the only way that the expert system of the present invention can be used on a real-time basis. Evaluation of all the rules in the rule network is accomplished in parallel. The time required for evaluating the rule network is a function of the depth of the network. Evaluation of the complete network requires n clock times where n is the depth of the network. The depth of the network is determined by the number of evaluations that must be accomplished to arrive at a conclusion. The network depth for FIG. 2 is 2; i.e., n=2. In this case the complete network can be evaluated in 2 clock times. A system compiler formulates a logical representation of the rule network 10 utilizing the most parallel implementation possible while reducing the number of logic gates that are required.

Before compiling, the rule network 10 is preferably simulated to ensure that specific inputs to the rule network generate the desired outputs. Preferably the CLIPS simulation program, which is known and understood by those skilled in the relevant technology, is utilized to perform the simulation.

The CLIPS simulation program, available from NASA, is an expert systems development tool which provides a complete development environment for the construction of rule and/or object based systems. In the case of the present invention, only the rule based system tools will be utilized. The CLIPS program includes its own language which is specifically used for the development and testing of an expert system. A program written in the CLIPS language consists of rules and facts. An inference engine in the simulator decides which rules should be executed and when the most optimum time for execution would occur. The CLIPS program also includes several development tools such as debugging aids, on-line help and an integrated editor. The CLIPS program is written in the "C" computer language and can be used on a variety of host computer systems, such as IBM PC compatible computers, Macintosh, VAX 11/780, Sun and HP9000-500 computers.

The CLIPS program also includes a verification and validation program which aids in the verification and validation of rules by providing cross referencing of patterns, style checking, and semantic error checking in addition to the simulation features. As indicated above, the CLIPS program is designed to be utilized with both object oriented and rule based expert systems. As the present invention utilizes a rule based system, many of the functions of the CLIPS program are not required to simulate and compile the expert system of the present invention. Therefore, a special version of the CLIPS program has been generated, called the CLIPS_PSP rule compiler or PSP compiler, which eliminates all of the unnecessary portions of the CLIPS program and is modified specifically to emulate the functions of the PSP of the present invention.

The CLIPS_PSP compiler does not include the input/output, debug and program control capabilities of the CLIPS program. In addition, the CLIPS_PSP compiler requires that all of the variables in the rule network 10 be removed from the code, and replaced with disjunctive terms, which are discussed in more detail below, before compiling the program. A syntax checker is used before compiling the rule network 10 to ensure that the syntax of the rule network 10 is compatible with the CLIPS_PSP compiler.

Figure 4:
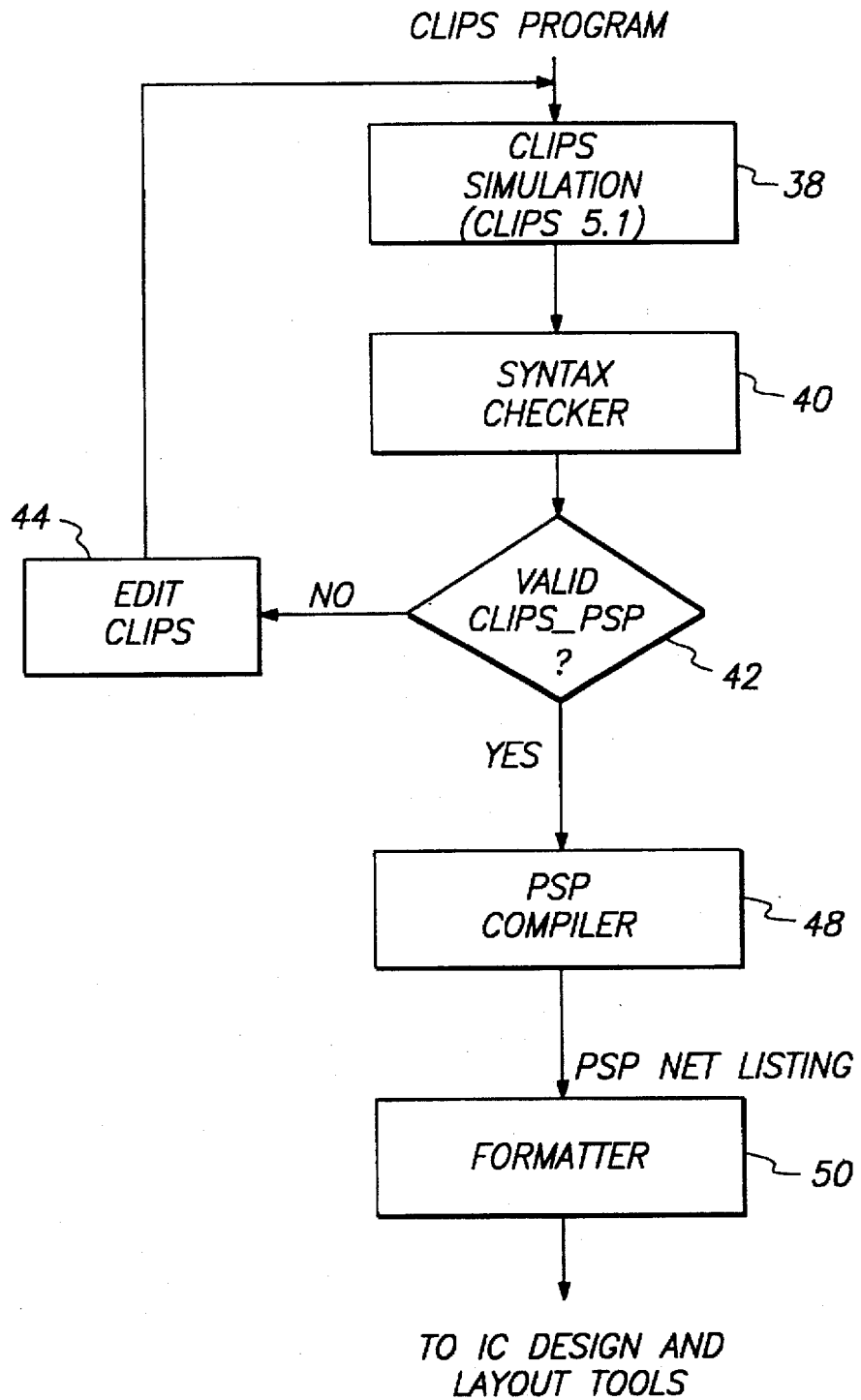
FIG. 4 is a flow chart which illustrates the presently preferred processes which are performed on the rule network from simulation to the generation of the net list for layout on a silicon chip.

FIG. 4 is a flow chart which illustrates the presently preferred processes which are performed on the rule network 10 from simulation to the generation of the net list for layout on a silicon chip. The rule network 10 is first simulated as in action block 38 using a simulation program (not shown), preferably CLIPS 5.1, to verify the proper operation of the rule base.

Figure 5:
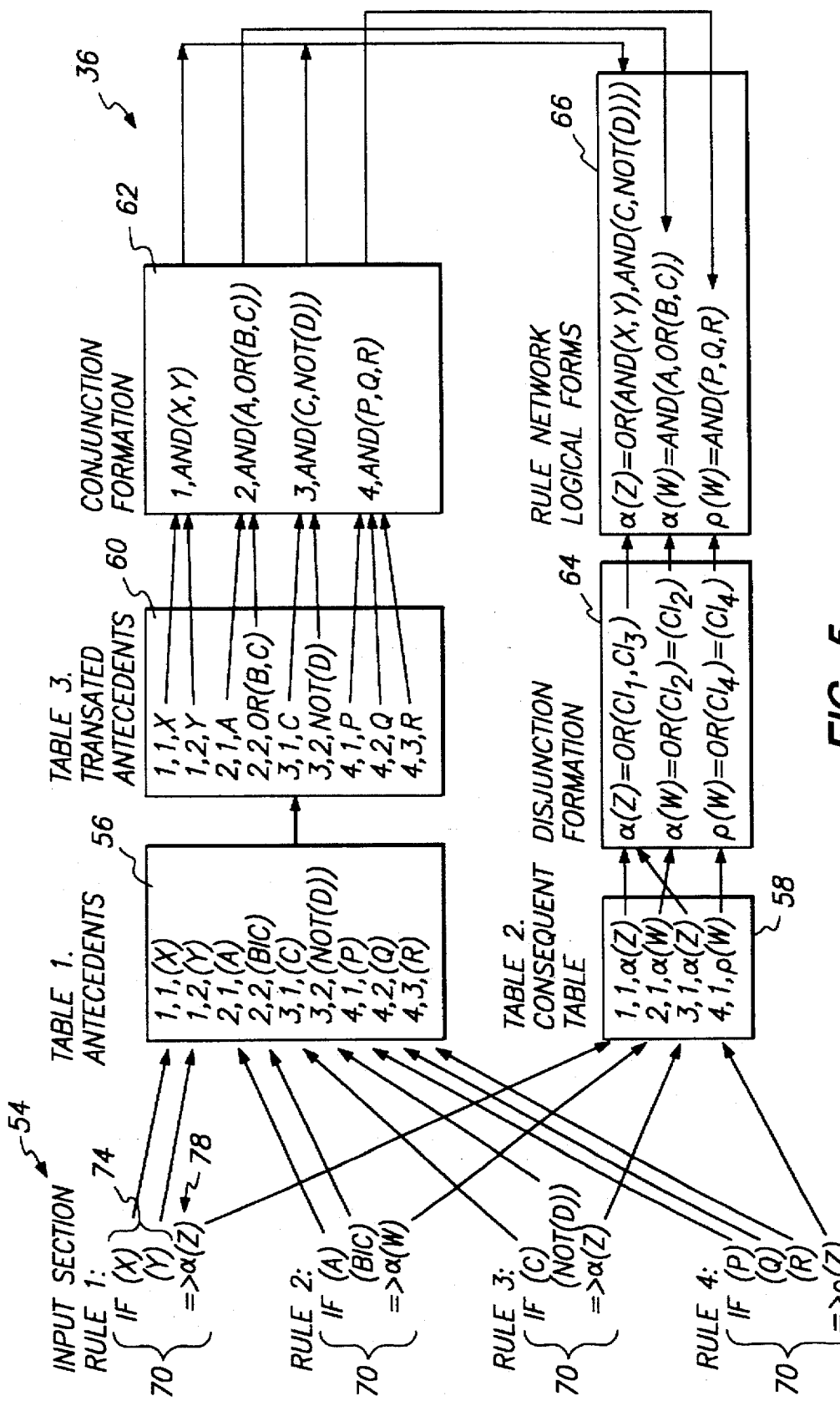
FIG. 5 is a block diagram of the rule network compiler of the present invention for generating the hardware connections for a rule network.

After the simulation is complete, the rule network 10 is fed into a syntax checker (not shown), as indicated in action block 40, to verify that the syntax used to define the rule network is compatible with the syntax of a rule compiler 36 (FIG. 5). The syntax checker is special purpose software that must be developed. It is not available from any other source. The syntax checker consists of a parser and a set of rules to ensure that the rule network description can be compiled by the rule compiler. Syntax checkers are well-known in the relevant technology. Preferably a modified version of the CLIPS program, referred to as CLIPS_PSP, is used for compiling the rule network 10. If the syntax used to define the rule network 10 is not valid for the rule compiler 36, as indicated by decision block 42, the rule network 10 is edited by a rule base developer using an off-the-shelf word processor program, as indicated in action block 44. Once the rule network 10 is edited, the revised rule network 10 is simulated, as indicated in action block 38, and the syntax check is performed again.

When the syntax of the rule network 10 is verified as being compatible with the rule compiler 36, as indicated in decision block 42, the rule network 10 is fed to the rule compiler 36, as indicated in action block 48. The output of the rule compiler 36 is a net list of the logical signal connections required to implement the rule network 10 in hardware. The preferred net list is defined by the Electronic Design Interchange Format (EDIF) division of the Electronics Industries Association (EIA). "The net list is fed to a formatter (not shown), as indicated in action block 50, where the net list is converted into a representation of the logic and interconnections of that logic. Standard IC design and layout tools such as, for example, Idea Station® 8.0 from Mentor Graphics Corporation are used to convert the net list into a logic network and other intermediate forms for subsequent implementation in silicon."

Figure 6:
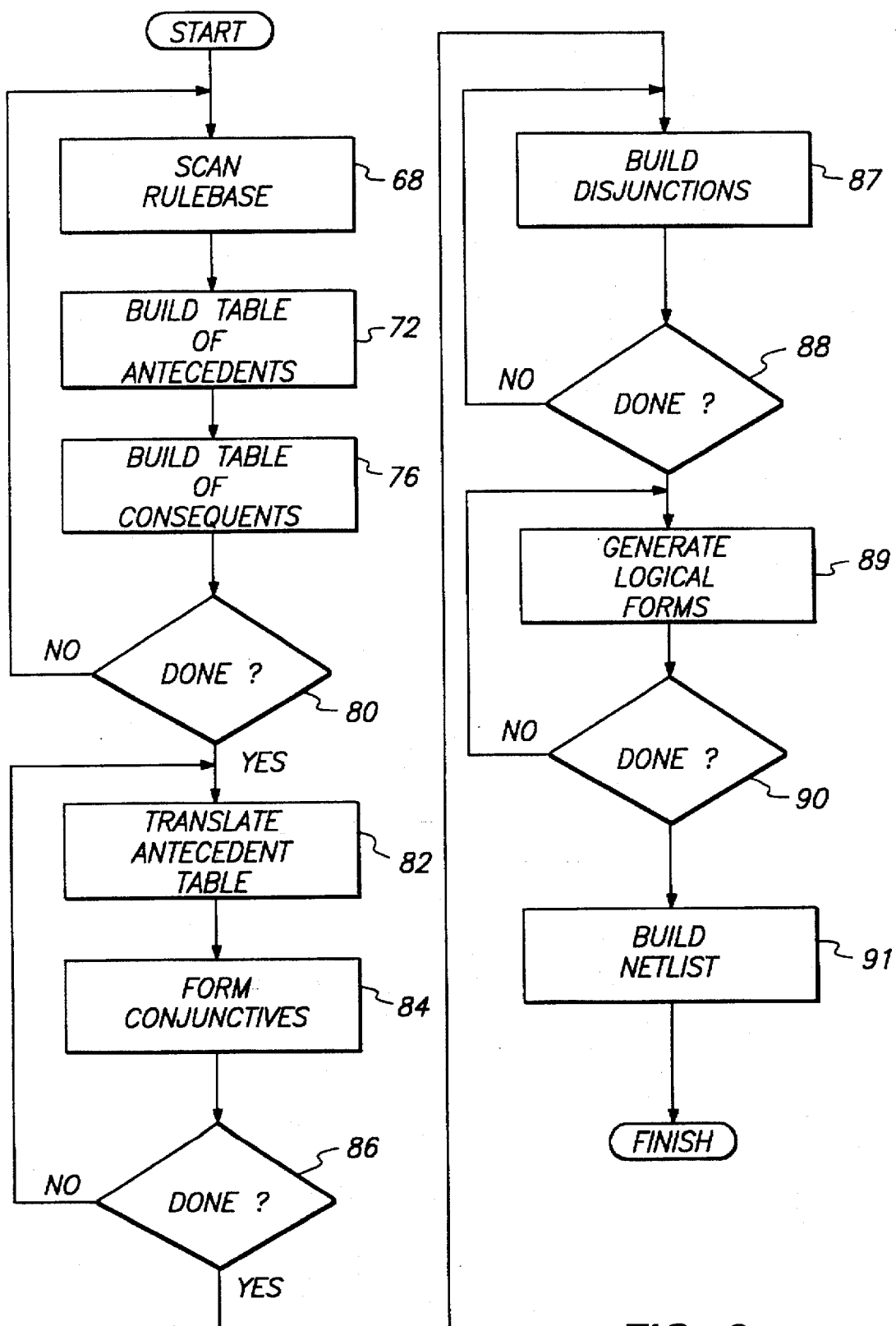
FIG. 6 is a flow chart illustrating the compiling program.

With particular reference to FIGS. 5 and 6, in the presently preferred embodiment of the present invention, the rule compiler 36 is used, in the context of the process shown in FIG. 4, to convert the rules of the rule network 10 into a digital logic implementation. FIG. 5 illustrates a typical rule compiler 36 used to compile a rule base such as the one defined by the rule network 10. The presently preferred embodiment of the compiler 36 is the CLIPS_PSP compiler. FIG. 6 is a flow chart illustrating the order of the steps that are required in order to compile the rule network 10.

Referring to FIG. 5, the compiler 36 comprises a rule network input section 54, an antecedents storage table 56, a consequents storage table 58, a translated antecedents storage table 60, a conjunction formation table 62, a disjunction formation table 64, and the rule network logical formation section 66. First, as indicated in action block 68 of FIG. 6, the compiler 36 scans in each rule 70 from the rule network input section 54, which reads a textual representation of the rules from an input file. As indicated in action block 72, the compiler 36 enters the individual patterns from the left hand side (e.g., 74) of the rules 70 into their own separate entry in the antecedent storage table 56. Similarly, as indicated in action block 76, the compiler 36 takes the patterns from the right hand side (e.g., 78) of each rule 70 and enters each pattern into its own separate entry in the consequents storage table 58. The process of entering each of the rules into the compiler 36 is repeated until all of the rules are entered into the antecedent storage table 56 and consequents storage table 58, respectively.

Continuing to refer to FIGS. 5 and 6, once all of the rules have been entered, as indicated in the decision block 80, the antecedent storage table 56 is simplified using a translation function as indicated in action block 82. The results of the translation are stored in the translated antecedent storage table 60. As indicted in action block 84, the compiler 36 scans the antecedent storage table 56 and collects all of the antecedents which pertain to the same rule 70. The antecedents that pertain to the same rule 70 are combined to form a logical conjunction, i.e., AND, of the patterns in the left hand side 74 of the rule 70, and are stored in the conjunction formation table 62.

Once all of the conjunctives have been formed, as determined in decision block 86, the compiler 36 then scans the consequents storage table 58 and identifies all of the rules 70 that will assert or retract a given working memory element 17 (FIG. 1). As indicated in action block 87, all of the terms which effect a common outcome are collected and a disjunction, i.e., OR, of the right hand side patterns 78 are formed, and stored in the disjunction formation table 64. Those terms in the disjunction formation table 64 which assert a working memory element 17 are represented by an A, and those which retract a working memory element 17 are represented by a o. Decision block 88 verifies that all of the disjunctions have been built.

Next, as indicated in action block 89, the terms from the conjunction formation table 62 are inserted into their respective locations in the disjunction formation table 64 and the results are stored in the rule network logical formation section 66. Decision block 90 verifies that all of the logical forms have been built and stored in the rule network logical formation section 66. The output of the compiler program 36 lists the results stored in the rule network logical formation section 66 which define the logical equation required to assert or deassert a particular working memory element 17. The compilation of these logical equations is the logical representation of the rule network 10.

As indicated in action block 91, a net list generator (not shown) in the compiler 36 builds a net list from the logical equation. The net list represents the preferred interconnection of the hardware, i.e., standard AND gates 28, OR gates 30, etc., which are used to implement the rule network 10. In the preferred embodiment of the present invention, after the net list is formatted (indicated at block 50 in FIG. 4) standard VLSI design techniques are utilized to layout the net list of the rule network 10 along with the remainder of the elements of the production system processor 100 of the present invention for implementation in hardware, for example, on a single silicon chip.

Referring again to FIG. 1, in general, the inference mechanism 2 of the production system processor 100, must constantly communicate with the outside world to update the status of the system. Communication with the outside world is typically controlled by the input data processor 4 and output data processor 6 of the production system processor 100. The output data processor 6 takes the results of the inference mechanism 2 as stored in the working memory elements 17 and writes the result of the inference into a specific external memory location or output port. When a specific production, or rule, asserts a particular working memory element 17 that is designated as an output element, then that assertion must be communicated via the address bus 16 and data bus 14 to the external device. Because the rule network 10 is designed to work in parallel, there can be several external assertions during the same clock cycle. The output data processor 6 is designed to handle these parallel assertions by sequentially outputting them over the address bus 16 and data bus 14 of the production system processor 100.

Figure 7:
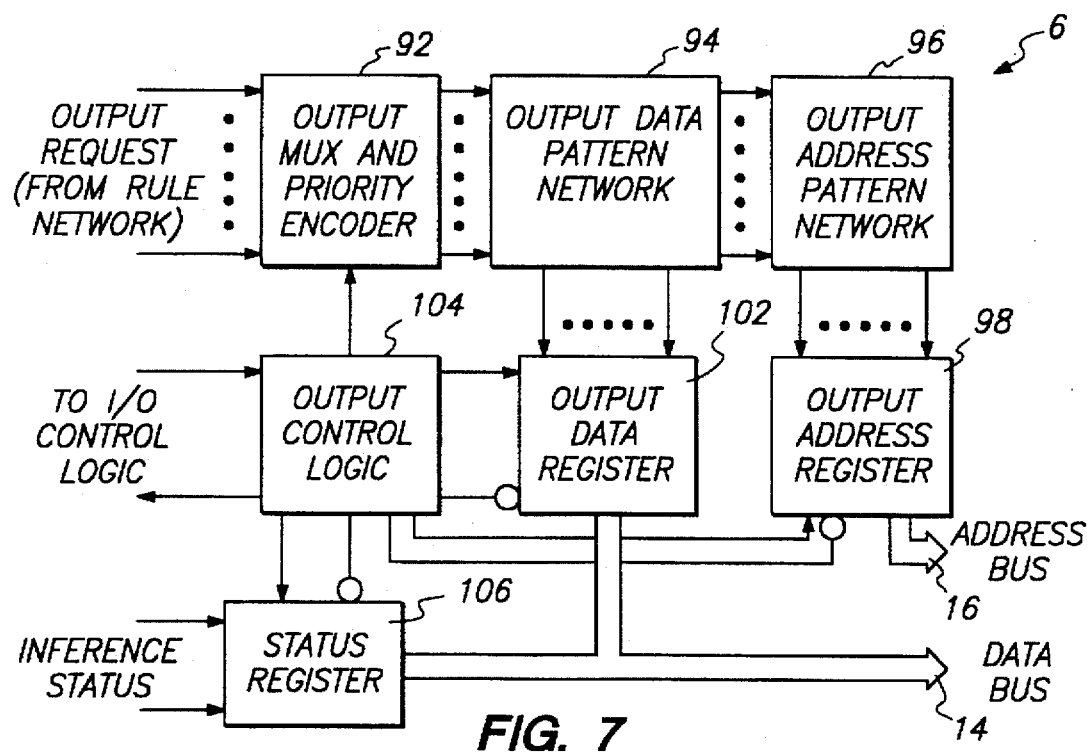
FIG. 7 is a block diagram of the output data processor shown in FIG. 1.

As illustrated in the block diagram of FIG. 7, the presently preferred output data processor 6 comprises an output multiplexer and priority encoder 92, an output data pattern network 94, an output address pattern network 96, an output address register 98, an output data register 102, output control logic 104 and a status register 106. The status register 106 is used when the production system processor 100 (FIG. 1) is slaved to another processor. The output multiplexer and priority encoder 92 are designed to prioritize the parallel output assertions. The highest priority assertion will be selected and fed to the output data pattern network 94 and to the output address pattern network 96. The output data pattern network 94 encodes the output assertion into an m-bit pattern describing the assertion. The m-bit data pattern is then routed to the output data register 102 where it waits for the external address bus 16 to become available. The output address pattern network 96 encodes the output assertion into an n-bit pattern which is the address of the external memory or the I/O port where the assertion is to be written. The n-bit address pattern is then routed to the output address register 98 where it waits for the external address bus 16 to become available.

The output control logic 104 monitors the output address bus 16 and data bus 14 availability. When the address bus 16 and data bus 14 are available, the output control logic 104 transfers the address and data information from the output address register 98 and the output data register 102 to the output address bus 16 and data bus 14, respectively, and asserts a write command to allow the data to be written to the external memory location. If immediate assertion of the output element is required, the direct access lines DIR-OUT lines 13 may be used which bypass the output data processor 6 and directly connect each at the working memory elements 17 to an external device.

Referring back to FIG. 1, the input data processor 4 is designed to input the condition of the external system into the various working memory elements 17 which serve as input nodes in the rule network 10. The data on the external conditions may come from external devices such as sensors or from external memory locations. An input operation is initiated when a working memory element 17 which is designated as an input request-node is asserted. As the rule network 10 is designed to operate in parallel several input requests may be asserted during the same clock cycle. The input data processor 4 is designed to handle these parallel assertions by sequentially reading the inputs and providing them to the requesting working memory element 17.

Figure 8:
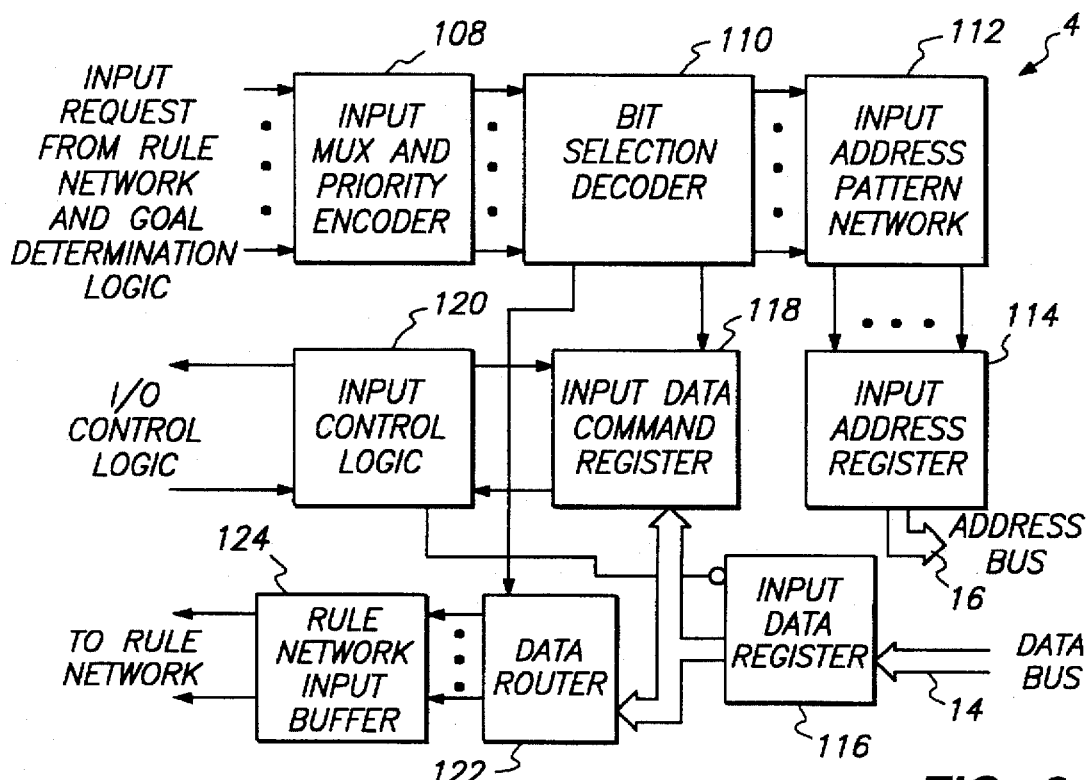
FIG. 8 is a block diagram of the input data processor shown in FIG. 1.

As illustrated in the block diagram of FIG. 8, the presently preferred input data processor 4 comprises an input multiplexer and priority encoder 108, a bit selection decoder 110, an input address pattern network 112, an input address register 114, an input data register 116, an input data command register 118, input control logic 120, a data router 122 and a rule network input buffer 124. The input data request by the rule network 10 is applied to the input multiplexer and priority encoder 108. The highest priority assertion will be selected and applied to the bit selection decoder 110 and the input address pattern network 112. The bit selection decoder 110 will determine which input node of the rule network 10 requested the data, and routes this information to the input data command register 118 and to the data router 122. The input data command register 118 is used when the production system processor 100 is slaved to another processor. The input address pattern network 112 encodes a unique n-bit input address pattern of the external memory element from which the specific input data is to be read. The input address pattern is then routed to the input address register 114 where it waits for the external address bus 16 to become available.

The input control logic 120 monitors the external address bus 16 availability. When the address bus 16 is available, the input control logic 120 transfers the address from the input address register 114 to the address bus 16, and asserts the READ command to allow the data to be read from the external hardware location. Once the requested data becomes available on the data bus 14, the input control logic 120 then latches the data into the input data register 116. The data from the input data register 116 is transferred to the data router 122. The data router 122 sends the data from the input data register 116 through the rule network input buffer 124 to the input node of the rule network 10, i.e., the working memory element 17, which requested the input data. If immediate assertion of the input nodes of the rule network 10 are required, the direct access input lines DIR-IN 15 may be used which bypasses the input data processor 4 and connects each external element directly to the working memory elements 17.

Referring generally to FIGS. 7 and 8, the production processor system 100 (FIG. 1) can be slaved to any external intelligent device, by allowing the intelligent device to have access to the I/O control logic 8 of the production system processor 100. When the production system processor 100 is slaved to master processor, the two processors communicate through the input data command register 118 of the input data processor 4 and the status register 106 of the output data processor 6. The input data command register 118 enables any external intelligent device, e.g., another production system processor or a standard microprocessor, to directly write commands through the I/O control logic 8 to control the operation of the production system processor 100. The status register 106 of the output data processor 6 is used to provide status information from the I/O control logic 8 on the current state of the production system processor 100 to the external intelligent device. These two registers enable constant communication between the master and the slave devices.

Figure 9:
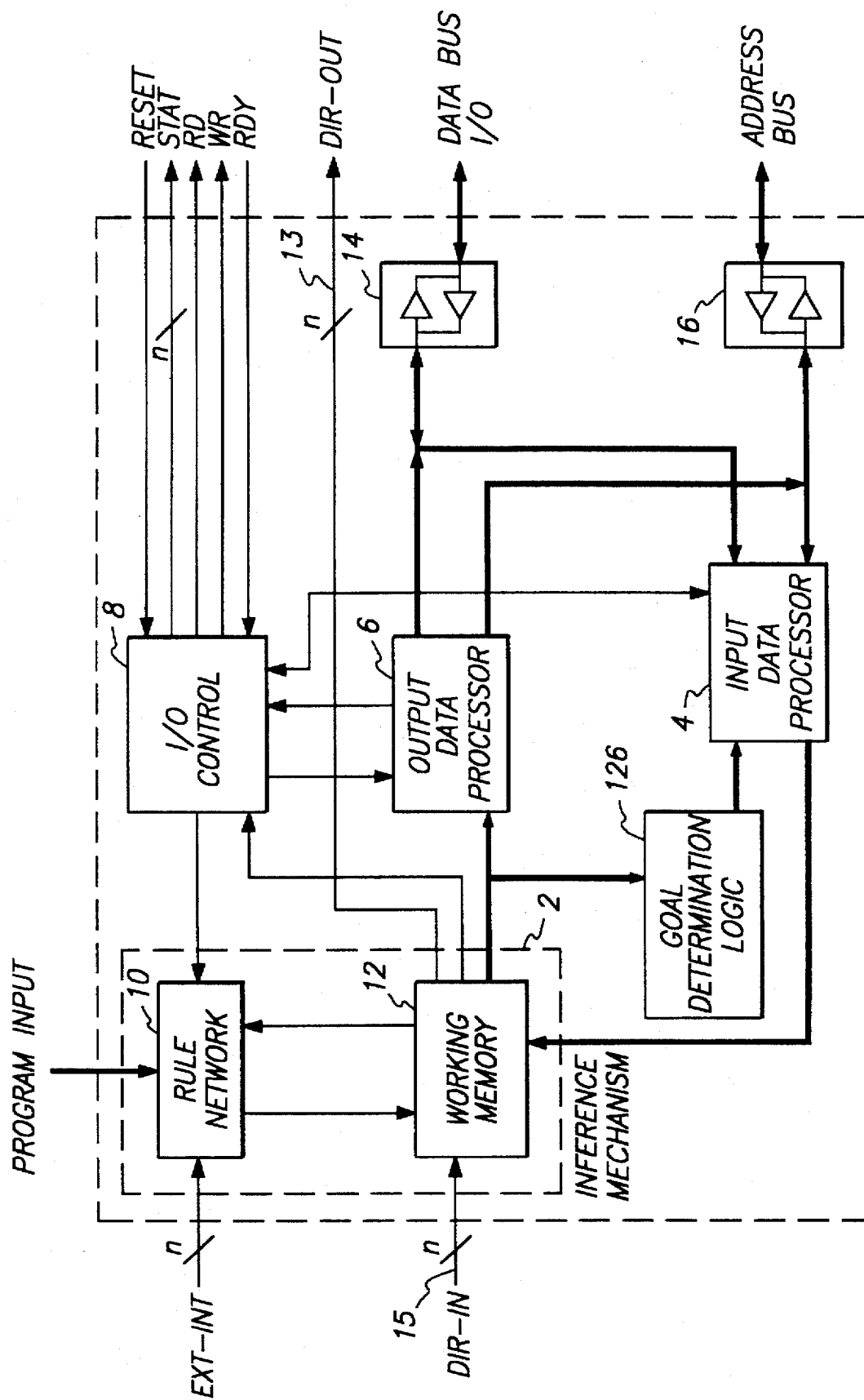
FIG. 9 is a block diagram of an alternate embodiment of the production system processor of the present invention which includes goal directed logic.

Now referring to FIG. 9, an alternate embodiment of the expert system of the present invention includes the ability to implement backwards chaining logic. Backwards chaining logic is used in an expert system when the user has a goal to be proved, i.e., a certain condition may have occurred and evidence in support of that assumption needs to be found. In one alternate embodiment of the production system processor 100, as illustrated in FIG. 9, goal determination logic 126 is used to implement the type of backwards chaining logic usually associated with goal-directed rather than data directed systems. The goal determination logic 126 communicates with the inference mechanism 2 and the input data processor 4 to determine if a particular goal is satisfied.

The goal determination logic 126 is utilized to select one out of an n number of goals which is to be proven true or false. Next the goal determination logic 126, determines the required data needed to prove the goal, and transmits its request to the input data processor 4. The input data processor 4 is used to retrieve the required data from the external information source and apply it to the inference mechanism 2. The inference mechanism 2 will apply the updated data to the inferences which are required to prove the goal, and will determine whether the goal is proved or disproved. Depending on the outcome of the inferences in the rule network 10, a working memory element 17 will be asserted or retracted. The data from the updated working memory element 17 will be sent to the output data processor 6 to alert the user of the outcome of the goal determination logic 126.

Figure 10:
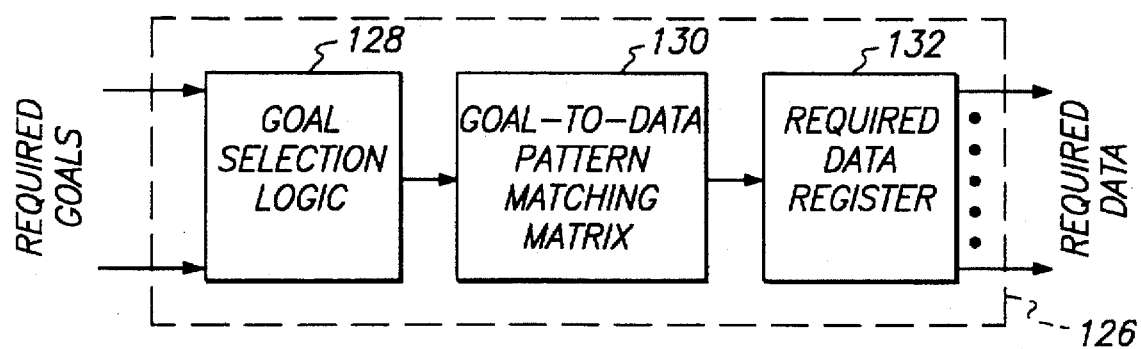
FIG. 10 is a block diagram of the goal determination logic illustrated in FIG. 9.
Figure 11A:
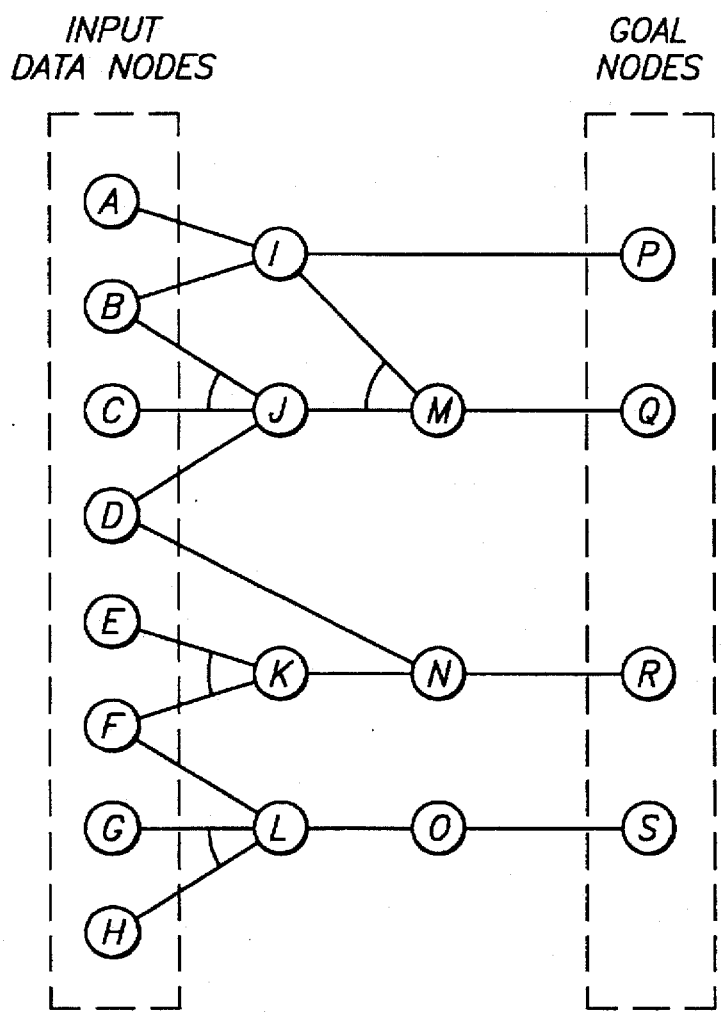
FIG. 11a is a graphical representation of an exemplary rule network to be handled by the goal determination logic.
Figure 11B:
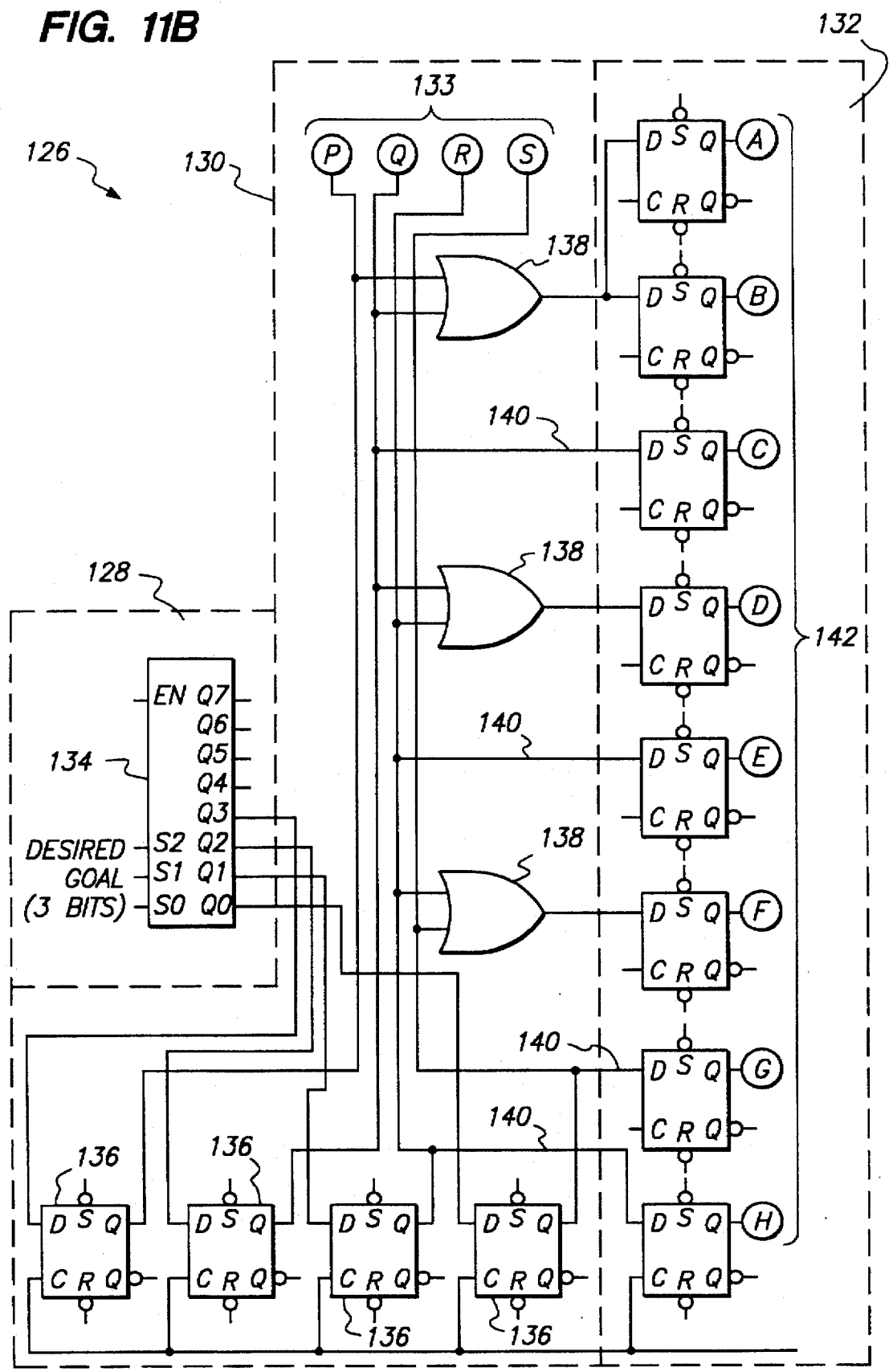

The preferred goal determination logic 126 of the present invention, as illustrated in block diagram form in FIG. 10, comprises goal selection logic 128, a goal-to-data pattern matching matrix 130, and a required data register 132. FIGS. 11a and 11b illustrate, respectively, an exemplary rule network and a schematic of an exemplary goal directed logic circuit 134. First, goal selection logic 128 is required to select one out of a number of goals 133 for proving. In the exemplary schematic of FIG. 11, a 1-of-8 decoder 134 is used to select one of up to eight possible goals 133 for proof. For example, each goal could be a particular type of failure in a system under test. Secondly, a goal-to-data pattern matching matrix 130 is used to map the desired goals 133 to the required data patterns. In the exemplary schematic of FIG. 11, the connection of several input flip-flops 136 to the required data register 132 via logic gates 138 and direct data lines 140 act as the goal-to-data pattern matching matrix 130. The input flip-flops 136 indicate which one of the goals 133 have been selected, i.e., goal P, Q, R or S (only four goals are shown in FIG. 11). The logic gates 138 and direct data lines 140 connect the goals to their respective required data inputs, i.e., data inputs A, B, C, D, E, F, G, and H.

With reference to FIGS. 10, 11a and 11b, the output of the goal-to-data pattern matching matrix 130 maps the required data inputs to prove the selected goal true into the required data register 132. The information in the required data register 132 is transferred to the input data processor 4 which retrieves the required data inputs and sends them to the rule network 10 for proving. In the exemplary schematic of FIG. 11b, a row of storage flip-flops 142 are connected to the output of the goal-to-pattern matching matrix 130 to store the required input parameters needed to prove the desired goal, thus acting as the required data register 132. The output of the storage flip-flops 142 are connected to the input data processor 4 to retrieve the current condition of the input parameters. The condition of the input parameters are applied to the rule network 10 to determine if the desired goal has been proven true.

Figure 12B:
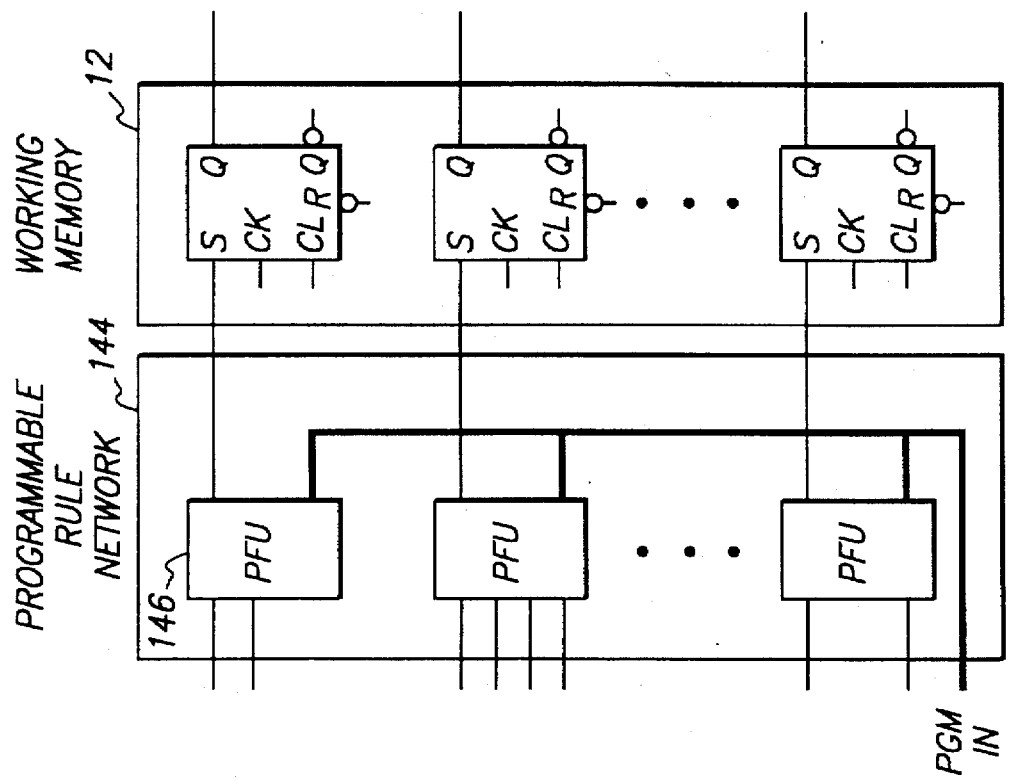
FIG. 12b is a block diagram of the dynamic inference mechanism showing the rule network and working memory.
Figure 12A:
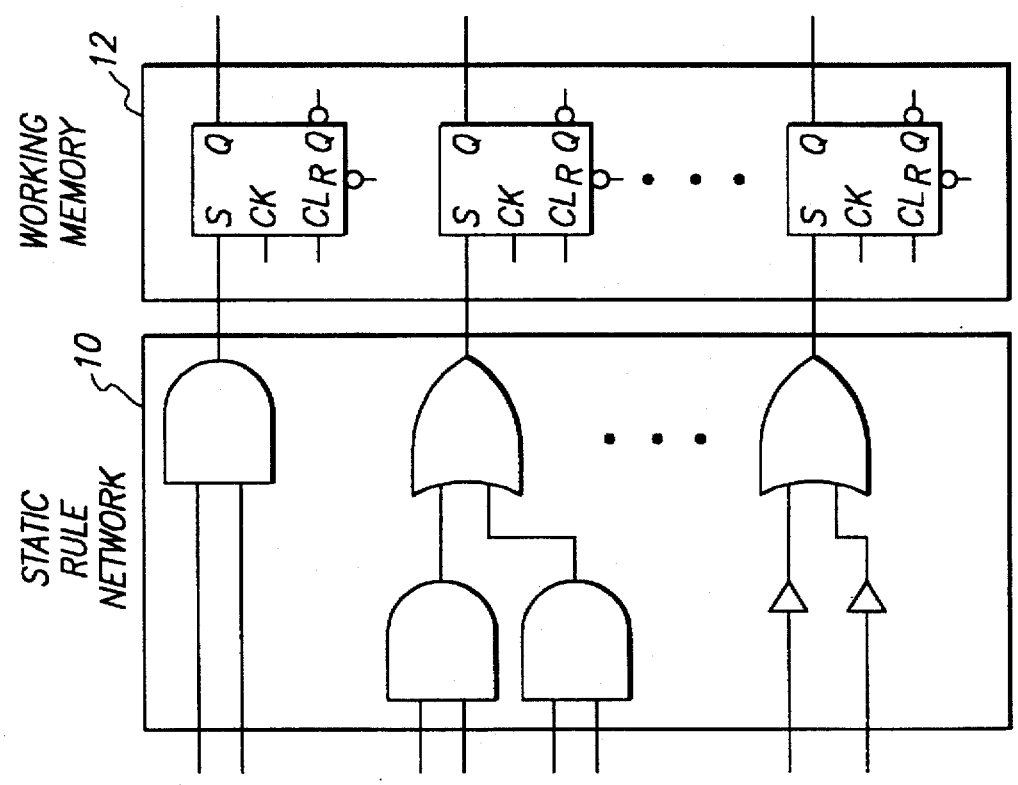
FIG. 12a is a block diagram of a static inference mechanism showing the rule network and working memory.

In another embodiment of the system 100 (FIG. 1) of the present invention, the static rule network 10 of the preferred embodiment of the production system processor 100 of FIG. 12a is reconfigured with a dynamic rule network 144, as illustrated in FIG. 12b. By utilizing a dynamic rule network 144, the set of rules which define the rule network 10 can be altered at any time while the system is in operation. The dynamic rule network 144 includes one or more programmable function units 146. As illustrated in FIG. 12b, several programmable function units 146 take the place of the digital logic implementation of the static rule network 10 in FIG. 12a to provide a dynamic rule network 144. Each working memory element 17 is hooked up to its own programmable function unit 146 which is capable of defining any logical function of n input variables, the result of which will assert or retract the individual working memory element 17.

Figure 13:
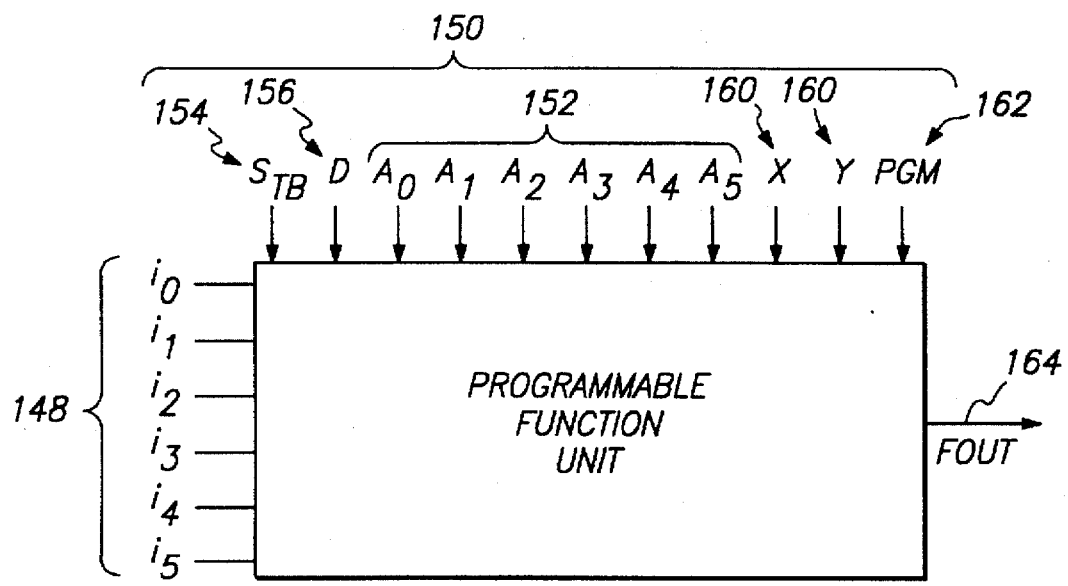
FIG. 13 is a block diagram of an exemplary programmable function unit of the dynamic inference mechanism illustrated in FIG. 12b.

FIG. 13 is a block diagram of an exemplary, six input programmable function unit 146. The programmable function unit 146 has two primary sets of inputs: the working or system input lines 148, and the program control input lines 150. The system input lines 148, labelled $i_0$-$i_5$ in FIG. 10, are the data inputs to the dynamic rule network 144 of the programmable function unit 146. The system input lines 148 receive signals from the input data processor 4, of the production system processor 100 as discussed above. The program control input lines 150, including programming address lines $A_0$-$A_5$ 152, programming strobe line STB 154, input line D 156, programmable function unit address lines X and Y 160 and program select line PGM 162, are used to program the logic function to achieve the desired action to be taken on the individual working memory element 17 at the programmable function unit output line 164, $F_{out}$. The PGM line 162 is used to chose between the program control inputs 150 and the system inputs lines 148 for each of the programmable function units 146. The programming address lines 152, $A_0$-$A_5$, are used to program each address of the programmable function unit 146 with its output value. The D input line 156 is used to enter in the desired output value of each address location of the programmable function unit 146. The STB line 154 is used during programming to enable the value of the D input line 156 to be written into its addressed location in the programmable function unit 146. The programmable function unit address lines 160, X and Y, are used to select a programmable function unit 146 for programming.

Figure 14:
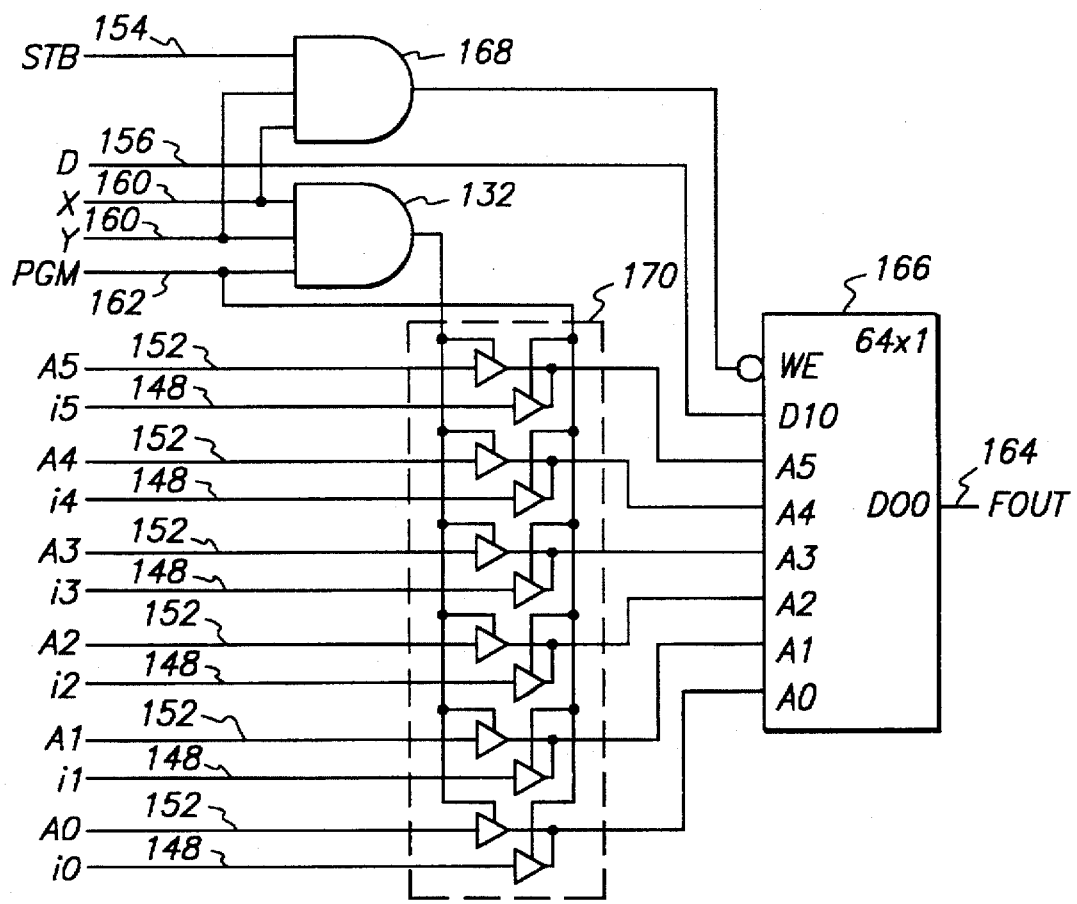
FIG. 14 is a logic schematic of an exemplary embodiment of the programmable function unit illustrated in FIG. 13.

FIG. 14 is an exemplary digital logic implementation of a single six input programmable function unit 146. In the exemplary embodiment of the programmable function unit 146, a 64×1 static RAM 166 is used to implement the programmable function unit 146. The static RAM 166 acts as a truth table of the conditions of the system input lines 148 and desired output actions, such that the programming address lines 152, $A_0$-$A_5$, represent a set of conditions of the system input lines 148, and the D input 156 represents the action to be taken to the working memory 12 when these conditions occur. If the D input 156 is a logic high, then the working memory element 17 attached to the programmable function unit 146 is asserted. If the D input 156 is a logic low, then the working memory element 17 attached to the programmable function unit 146 will be retracted.

To program the programmable function unit 146, the address of the programmable function unit 146 must be supplied by the X, Y select lines 160 and the programmable function unit address lines 152 and the PGM line 162 must be at a logic high at the inputs of the combinatorial logic 168. If all of the conditions are met, the combinatorial logic 168 is tied to one of the enable lines of a tri-state buffer 170 which will allow the programming address lines 152, $A_0$-$A_5$, to be applied to the input of the static RAM 166 instead of the system input lines 148. The PGM line 162 is tied to the other enable line of the tri-state buffer 168 which enables the system inputs 148, $i_0$-$i_5$, to be applied to the static RAM 166 when the PGM line 162 is a logic low. Once the programming address lines 152, $A_0$-$A_5$, and the D input 156 are available at the inputs of the static RAM 166, the programmable function unit 146 is strobed with the STB line 154. Combinatorial logic 172 will insure that the values of the programmable function unit address lines 160, X and Y, are addressing the correct programmable function unit 146 and will wait for the a signal on the STB line 154 before allowing the value of the D input 156 to be programmed into the RAM 166 for the given address.

During the initialization of the system 100 (FIG. 1), each of the addresses of the programmable function unit 146 must be programmed with their desired output action at the $F_{out}$ line 164. Once the entire RAM 166 has been programmed, each individual input of the RAM 166 can be reprogrammed without reprogramming every address of the entire RAM 166. When the programming is completed, the PGM line 162 returns to a logic zero which enables the system input lines 148, $i_0$-$i_5$, to access the RAM 166. The system input lines 148 will reflect a specific condition of the system at the present time. These system input lines 148 are used to address the RAM 166 of the programmable function unit 146, to determine the specific output at the $F_{out}$ line 164 which was previously programmed into the static RAM 166. A signal on the output line $F_{out}$ 164 will then assert or retract its assigned working memory element 17.

During normal operation of the system, i.e., the RAM 166 is not being programmed, the individual programmable function units 146 are not individually addressable. Rather, the same system inputs 148, i.e., system conditions, are applied to all of the programmable function units 146 in parallel, and they each formulate their own inference from the system inputs 148, depending on how each programmable function unit 146 was programmed. The only time that the individual programmable function units 146 are addressed individually, using the programmable function unit address lines 160 is when they are programmed. The individual addressing of the programmable function units 146 during programming enables each programmable function unit 146 to be programmed to react differently to the same set of system inputs 148.

The advantages of a dynamic rule network 144 are clear, as the expert system can be reprogrammed during operation to react differently to a specific set of inputs. This causes the system to be extremely flexible, and can increase the complexity and the number of conditions that the system monitors. For example, if the production system processor 100 is slaved to another intelligent device, the intelligent device can reprogram the dynamic rule network 144 of the production system processor during system operation in response to the occurrence of an external event. The principal disadvantage of using a dynamic rule network 144 is the amount of space on the production system processor chip that is taken up by the programmable function units 146. It takes more silicon to produce a production system with a dynamic inference rule network 144, than it does to produce a production system processor with a static rule network 10. By using standard VLSI design techniques, both embodiments, i.e., having either a static rule network 10 or a dynamic rule network 144, are implementable on a single silicon, or other such semiconductor type, of chip.

Figure 15:
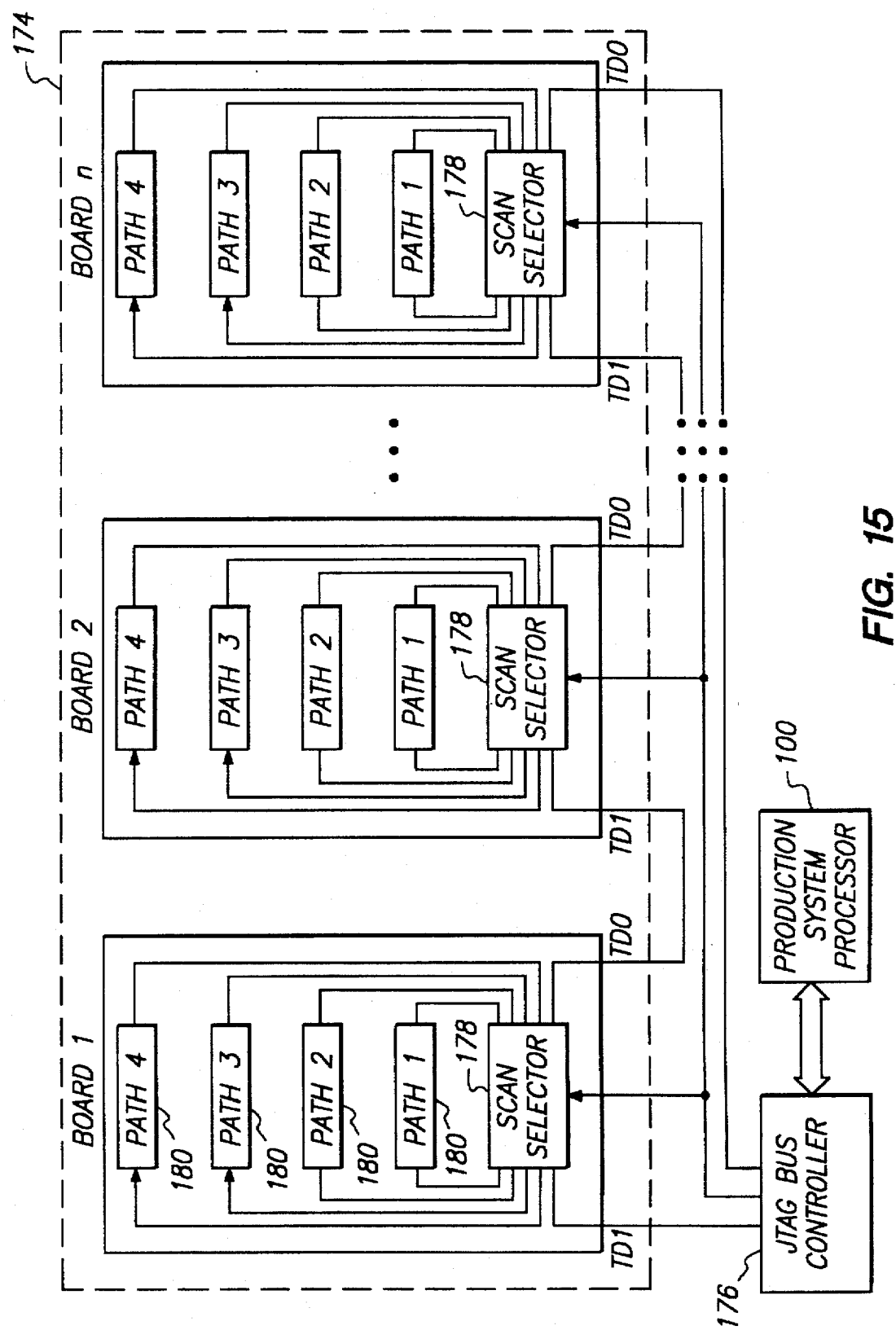
FIG. 15 is a block diagram of a test system utilizing the production system processor of the present invention in communication with a multi-board system that utilizes boundary-scan architecture.

Preferably, the production system processor 100 of the present invention can be used as an embedded diagnostic system. By utilizing the preferred single chip implementation of the production system processor 100, many systems can include a built in test and diagnostic system without adding a significant amount of hardware to the original system. FIG. 15 illustrates an exemplary type of system architecture which could be used with the production system processor 100 of the present invention for a built in test system. The production system processor 100 can tap into the system bus of a system under test 174 to retrieve the required test data from the system under test 174. The production system processor 100 applies the data to its internal rule network 10, and sends the test results back to the system under test 174 or to an external sensory device such as a warning panel. This will enable a system to perform self-test and self-diagnosis while the system is performing its intended function. The simultaneous performance of the system's intended function and the system's test function reduces the amount of down time that is required to perform routine testing, as all routine testing functions are automatically performed with the production system processor 100. Further, the rule network 10 of the expert system can be designed to recognize a failure and make a probable diagnosis of the suspected origin of the failure. Thus, by embedding the production system processor 100 in the system hardware, the simultaneous performance of the system's operation, fault detection, and diagnosis can all be implemented within the original system without effecting the operation of the functional system.

Of particular concern in developing an accurate test system is the availability of sufficient data indicating the status of the system under test. The system under test 174 must have adequate self-test and monitoring capabilities to capture the required diagnostic data. The IEEE has developed IEEE Standard Number 1149.1-1990, entitled "IEEE Standard Test Access Port and Boundary-Scan Architecture" in order to define the type of system architecture that is required to enable diagnostic data to be captured. IEEE standard Number 1149.1-1990 is hereby incorporated by reference. One presently preferred production system processor 100 is specifically designed to communicate with a system that incorporates the IEEE Standard Boundary-Scan architecture.

The block diagram of FIG. 15 illustrates the production system processor 100 of the present invention in communication with a multi-board system under test 174 that utilizes the boundary-scan architecture. An IEEE 1149.1 (also called JTAG) bus controller 176 is utilized to route test data from the boards of the system under test 174 to the production system processor 100. The JTAG bus controller 176 communicates with a scan selector 178 on each of the boards of the system under test 174. The scan selector 178 chooses which data path 180 from the system under test 174 will be used to send data to the production system processor 100 depending on the type of data that is requested from the input data processor 4. A typical scan selector device 176 is a 54ACT8997 or a 54ACT8999 chip available from Texas Instruments. The data that is sent and received from the system under test 174 is in serial form. The JTAG bus controller 176 converts the serial test data to parallel and controls the communication between the system under test 174 and the production system processor 100 of the present invention. By combining a standard test architecture, such as the boundary-scan architecture, with the production system processor 100 of the present invention, a universal test system architecture can be formed. Such a universal test system architecture, will provide the expert system with the data on the condition of the system under test 174, and will enable the expert system to report out its diagnosis to the system under test. Other architectures, such as the master and slave architecture discussed above, are useful for embedded test systems, as long as the necessary data from the system under test is continuously provided to the production system processor 100 of the present invention.

The present invention may be embodied in other specific forms without departing from its spirit or essential characteristics. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed is:

1. A universal test system, comprising:

a production system processor having an inference circuit, comprising:
a rule network connected to a working memory,
circuitry receiving input data from a bus and applying the input data to the inference circuit, and
circuitry reading output data from the inference circuit and transmitting the output data to the bus; and a plurality of system circuits containing boundary-scan inputs and outputs in communication with the production system processor over the bus so that the system circuits are tested by the production system processor.

2. The system defined in claim 1, wherein the working memory comprises a plurality of flip flops.

3. The system defined in claim 1, wherein the rule network comprises digital logic indicative of an AND/OR graph.

4. The system defined in claim 1, wherein the boundary-scan inputs and outputs are defined by IEEE Standard Number 1149.

5. In a universal test system having a production system processor with an inference circuit comprising a rule network connected to a working memory and a plurality of system circuits containing boundary-scan inputs and outputs in communication with the production system processor over a bus, a method of testing the system circuits, comprising the steps of:

receiving input data from a bus;
applying the input data to the inference circuit;
inferencing the input data in the inference circuit thereby producing output data;
reading output data from the inference circuit;
transmitting the output data to the bus; and
testing the system circuits over the bus.

* * * * *